United States Patent
Simion et al.

(10) Patent No.: US 12,027,610 B2
(45) Date of Patent: Jul. 2, 2024

(54) QUBIT DEVICE AND A METHOD FOR OPERATING A QUBIT DEVICE

(71) Applicant: IMEC VZW, Leuven (BE)

(72) Inventors: George Eduard Simion, Heverlee (BE); Fahd Ayyalil Mohiyaddin, Kessel-Lo (BE); Stefan Kubicek, Pellenberg (BE); Bogdan Govoreanu, Hulshout (BE); Florin Ciubotaru, Heverlee (BE); Ruoyu Li, Leuven (BE)

(73) Assignee: IMEC VZW, Leuven (BE)

( * ) Notice: Subject to any disclaimer, the term of this patent is extended or adjusted under 35 U.S.C. 154(b) by 469 days.

(21) Appl. No.: 17/474,175

(22) Filed: Sep. 14, 2021

(65) Prior Publication Data

US 2022/0083890 A1    Mar. 17, 2022

(30) Foreign Application Priority Data

Sep. 15, 2020   (EP) ................................ 20196304

(51) Int. Cl.
*H01L 29/66*    (2006.01)
*G06N 10/00*    (2022.01)
(Continued)

(52) U.S. Cl.
CPC ....... *H01L 29/66977* (2013.01); *G06N 10/00* (2019.01); *H10N 50/80* (2023.02); *B82Y 10/00* (2013.01)

(58) Field of Classification Search
CPC ............. H01L 29/423; H01L 29/66977; H01L 29/66984; H01L 29/82; H10N 50/20;
(Continued)

(56) References Cited

U.S. PATENT DOCUMENTS

| 2016/0300155 A1* | 10/2016 | Betz ........................ G06N 10/00 |
| 2019/0044048 A1 | 2/2019 | Caudillo et al. |
| 2020/0161455 A1 | 5/2020 | Clarke et al. |

FOREIGN PATENT DOCUMENTS

WO    WO-2010131182 A1    11/2010

OTHER PUBLICATIONS

Hollmann et al., "Large, tunable valley splitting and single-spin relaxation mechanisms in a Si/Si$_x$Ge$_{1-x}$ quantum dot", Arxiv.org, Cornell University Library, 201 Olin Library Cornell University Ithaca, NY 14853, Jul. 9, 2019 (Jul. 9, 2019), XP081632127, DOI: 10.1103/PHYSREVAPPLIED.13.034068.
(Continued)

*Primary Examiner* — Cheung Lee
(74) *Attorney, Agent, or Firm* — MOSER TABOADA

(57) ABSTRACT

According to an aspect of the present inventive concept there is provided a qubit device comprising: a semiconductor substrate layer; a set of control gates configured to define a row of electrostatically confined quantum dots along the substrate layer, each quantum dot being suitable for holding a qubit; and a set of nanomagnets arranged in a row over the substrate layer such that a nanomagnet is arranged above every other quantum dot of the row of quantum dots, wherein each nanomagnet has an out-of-plane magnetization with respect to the substrate layer and wherein every other quantum dot is subjected to an out-of-plane magnetic field generated by a respective nanomagnet, such that a qubit spin resonance frequency of every other quantum dot is shifted with respect to an adjacent quantum dot of the row of quantum dots.

18 Claims, 6 Drawing Sheets

(51) Int. Cl.
  *H10N 50/80* (2023.01)
  *B82Y 10/00* (2011.01)

(58) Field of Classification Search
  CPC ........ H10N 50/80; H10N 50/85; G06N 10/00; G06N 10/20; G06N 10/40; G06N 10/60; G06N 10/70; G06N 10/80; G06F 2111/14; B82Y 10/00
  See application file for complete search history.

(56) References Cited

OTHER PUBLICATIONS

Mohiyaddin et al., "Multiphysics Simulation & Design of Silicon Quantum Dot Qubit Devices", 2019 IEEE International Electron Devices Meeting (IEDM), IEEE, Dec. 7, 2019 (Dec. 7, 2019), XP033714495, DOI: 10.1109/IEDM19573.2019.8993541 [retrieved on Feb. 10, 2020].

Yang et al., "Operation of a silicon quantum processor unit cell above one Kelvin", Nature, Macmillan Journals Ltd., Etc, London, vol. 580, No. 7803, Apr. 1, 2020 (Apr. 1, 2020), pp. 350-354, XP037092437, ISSN: 0028-0836, DOI: 10.1038/S41586-020-2171-6 [retrieved on Apr. 15, 2020].

Noiri et al., "A fast quantum interface between different spin qubit encodings", Nature Communications 9 5066, doi: 10.1038/S41467-018-07522-1, dated 2018, pp. 1-7.

Watson, et al., "A programmable two-qubit quantum processor in silicon", Nature 555, 633, QuTech and the Kavli Institute of Nanoscience, et al., dated Jun. 1, 2018, pp. 1-22.

West et al., "Gate-based single-shot readout of spins in silicon", Nature Nanotechnology 14, 437-441, Centre for Quantum Computation and Communication Technology, et al., dated Oct. 2, 2018, pp. 1-10.

European Search Report for EP Application No. 20196304 dated Feb. 26, 2021.

Fogarty, et al., "Integrated Silicon qubit platform with single-spin addressability, exchange control and single shot singlet triplet readout", 2018, Nature Communications, DOI: 10.10.38/s41467-018-06039-x, pp. 1-8.

Li, et al., "A crossbar network for silicon quantum dot qubits", Science Advances Jul. 6, 2018, Condensed Matter Physics, downloaded from http://advances.sciencemag.org/on Jun. 5, 2020, pp. 1-11.

Mills, et al., "Shuttling a single charge across a one-dimensional array of silicon quantum dots", Nature Communications 2019, https://doi.org/10.1038/s41467-019-08970-z, pp. 1-6.

Yoneda, et al., "A quantum-dot spin qubit with coherence limited by charge noise and fidelity higher than 99.9%", Nature Nanotechnology, vol. 13, Feb. 2018, https://doi.org/10.1038/s41565-017-0014-x, pp. 102-106.

* cited by examiner

QUBIT DEVICE AND A METHOD FOR OPERATING A QUBIT DEVICE

CROSS-REFERENCE TO RELATED APPLICATIONS

The current application is a national phase application of European patent application number 20196304.8, filed Sep. 15, 2020, which patent documents are incorporated herein in their entireties.

TECHNICAL FIELD

The present inventive concept relates to a qubit device as well as a method for operating a qubit device.

BACKGROUND

In recent years, considerable progress has been made in the development of semiconductor quantum dot qubits. Semiconductor quantum dots enable definition of high-fidelity qubits (i.e. "spin qubits") by the spin states of electrons confined at the quantum dots. Semiconductor quantum dots may be formed in e.g. a silicon-based platform from a 2DEG using electrostatic gates. This enables a compact realization of spin qubits, employing conventional fabrication techniques from CMOS technology. For these reasons, among others, semiconductor quantum dot qubit-technology represents a promising candidate for scalable qubit systems.

Quantum dot spin qubits may be controlled using Electron spin resonance (ESR) wherein the spin states are manipulated by radio-frequency AC magnetic fields. In Electric dipole spin resonance (EDSR) the spin states are instead manipulated by radio-frequency AC electric fields. EDSR may enable more efficient and less complex pulse schemes for qubit control compared to ESR. However, EDSR relies on a coupling between the electric field and the spin of the qubit and the spin-orbit coupling for electrons in e.g. silicon is typically too weak to support EDSR. This has been addressed in the prior art, by proof-of-concept devices incorporating on-chip micromagnets to create a spatially variable in-plane spin-electric-field-coupling field at the quantum dot (e.g. Mohiyaddin F. A. et al, Multiphysics Simulation & Design of Silicon Quantum Dot Qubit Devices. IEDM).

Despite recent advances, there is however still a need for qubit device designs further facilitating scalability.

SUMMARY

An objective of the present inventive concept is to provide an improved qubit device, facilitating scalability to greater number of qubits. Further and alternative objectives may be understood from the following.

According to an aspect of the present inventive concept there is provided a qubit device comprising:
  a semiconductor substrate layer;
  a set of control gates configured to define a row of electrostatically confined quantum dots along the substrate layer, each quantum dot being suitable for holding a qubit; and
  a set of nanomagnets arranged in a row over the substrate layer such that a nanomagnet is arranged above every other quantum dot of the row of quantum dots,
  wherein each nanomagnet has an out-of-plane magnetization with respect to the substrate layer and wherein every other quantum dot is subjected to an out-of-plane magnetic field generated by a respective nanomagnet, such that a qubit spin resonance frequency of every other quantum dot is shifted with respect to an adjacent quantum dot of the row of quantum dots.

The inventive qubit device provides a scalable design enabling multi-qubit systems.

The device supports definition of area efficient and highly confined quantum dots suitable to hold electron qubits, such as single electron qubits. Using control gates to define electrostatically confined quantum dots further enables coupling of neighbouring quantum dots qubit transfer between quantum dots by sequentially shuttling a qubit/electron between adjacent quantum dots by varying the potentials at the quantum dots.

The small dimensions offered by nanomagnets, together with their arrangement above the substrate contributes to the area efficiency of the device design.

Furthermore, the provision of nanomagnets with an out-of-plane magnetization with respect to the substrate layer allows inducing a magnetic field (with an out-of-plane orientation) in the respective quantum dot underneath each nanomagnet. Defining (only) every other quantum dot of the row of quantum dots underneath (and thus to be aligned with) a respective one of the nanomagnets results in shifting of the qubit spin resonance frequency at every other quantum dot with respect to an adjacent quantum dot. This in turn allows qubits in quantum dots located underneath nanomagnets to be addressed selectively to qubits in quantum dots not located underneath nanomagnets.

An out-of-plane orientation of the magnetic field further mitigates undesired spin-orbit coupling and variation of the Lande g-factor produced by substrate-interface non-uniformities. An in-plane magnetic field at the quantum dots may cause a residual spin-orbit coupling that may introduce a degree of unpredictability for the qubit resonant frequencies.

The row of quantum dots may accordingly define a first subset of quantum dots and a second subset of quantum dots, the quantum dots of the first subset alternating the quantum dots of the second subset, wherein each quantum dots of the first subset is defined underneath a respective one of the nanomagnets and has a qubit spin resonance frequency shifted with respect to an adjacent qubit of the second subset of qubits. For conciseness, any quantum dot defined underneath a respective one of the nanomagnets may accordingly in the following be referred to as a first quantum dot. Correspondingly, any quantum dot defined adjacent to a first quantum dot may be referred to as a second quantum dot.

As will become apparent from the below, every first quantum dot may be used for controlling a qubit, while every second any quantum dot may be used to hold idle qubits. Accordingly, the first quantum dots and the second quantum dots may be referred to as "active" and "idle" quantum dots.

As used herein, the term "out-of-plane" (e.g. in relation to a magnetization or a magnetic field) refers to an orientation or direction at least having a major component transverse to the substrate layer (e.g. to a main plane of extension of the substrate layer).

As used herein, the term "nanomagnet" refers to a permanent magnet with a submicron dimension, e.g. at least a submicron length dimension (i.e. along a longitudinal direction of the row), preferably also a submicron width dimension (i.e. along a transverse direction to the row, in plane with respect to the substrate layer). Also a height or thickness dimension of the nanomagnets (i.e. along an out-of-plane direction with respect to the substrate layer) may be of a submicron dimension. A length dimension and a width dimension of the nanomagnets may according to embodiments be 200 nm or less, advantageously 150 nm or less. A length dimension of the nanomagnets may in any case be such that each nanomagnet extends above (i.e. "covers") only a single respective quantum dot. A height dimension of the nanomagnets may be greater than the length and/or width dimensions, such as 200 nm or greater.

The substrate layer may be a silicon substrate layer. Silicon supports definition of high-fidelity electrostatically confined quantum dot qubits. Moreover, in view of its nearly ubiquitous use in integrated circuit technology silicon represents an advantageous platform for a qubit device.

The qubit device may in addition to the nanomagnets comprise a magnetic arrangement configured to contribute with a uniform out-of-plane magnetic field to each quantum dot. It is to be understood that this magnetic field contribution is in addition to the out-of-plane magnetic fields generated by the nanomagnets.

According to embodiments, each quantum dot of said every other quantum dot may have a same first qubit spin resonance frequency and each quantum dot of said adjacent quantum dots may have a same second spin resonance frequency.

Every other quantum dot underneath a nanomagnet (i.e. first quantum dots) may thus present a common "first" spin resonance frequency. Correspondingly, every quantum dot adjacent to one of every other quantum dot (i.e. second quantum dots) may present a common "second" spin resonance frequency. A "common" first/second spin resonance frequency does in this context mean that every qubit in a respective quantum dot of the first/second subset may be excited with an oscillating field (magnetic or electric) of a same spectral content. That is, a common first/second spin resonance frequency implies that the spin resonance frequencies of all first quantum dots overlap, and that the spin resonance frequencies of all second quantum dots overlap. Thereby the first quantum dots may be addressed in parallel, selectively to qubits in any one of the second subset of quantum dots. A separation between the first and second qubit spin resonance frequencies may be greater than the (respective) line widths of the first and second qubit spin resonance frequencies, advantageously by two orders of magnitude, or more. A difference in out-of-plane magnetic field strength at a first quantum dot and an adjacent second quantum dot may advantageously be 5 mT or greater.

According to embodiments, the set of control gates may comprise barrier gates and plunger gates arranged alternatingly along a longitudinal direction of the row of quantum dots.

This configuration enables definition of highly confined quantum dots using a limited number of control gates.

As used herein, the term "barrier gate" refers to a gate configured to confine the quantum dots in a longitudinal direction of the row of quantum dots. Each barrier gate may define a tunnel barrier between each pair of neighbouring quantum dots.

As used herein, the term "plunger gate" refers to a gate configured to control a (electrochemical) potential of a respective quantum dot. Each plunger gate is hence associated with a respective quantum dot. Each plunger gate may control the charge accumulated at the associated quantum dot.

The set of control gates may further comprise a pair of longitudinal confinement gates arranged at mutually opposite sides of the row of quantum dots.

As used herein, the term "longitudinal confinement gate" (for brevity "confinement gates") refers to a gate configured to confine the quantum dots in a transverse direction (in-plane with respect to the substrate layer) with respect to the row of quantum dots. The pair of confinement gates may be common to all quantum dots of the row, thereby limiting the number of control gates required.

The barrier gates may all have a same gate length and be arranged with a regular pitch (i.e. center-to-center distance). The plunger gates may all have a same gate length and each plunger gate may be centred between a respective pair of barrier gates.

A regular arrangement of the barrier and plunger gates enables definition of an electrostatic potential for qubits which varies periodically along a longitudinal direction of the row of quantum dots (i.e. "the qubit row-direction"). In addition to contributing to uniform electrical properties of the quantum dots, it is has been realized that a periodic and regular potential for the qubits makes operation of the qubit device less sensitive to possible alignment errors of the nanomagnets. As may be appreciated, a pitch of the nanomagnets may be twice the pitch of the barrier gates.

A pitch of the barrier gates may be in the range of 50 to 150 nm. A center-to-center distance between a barrier gate and an adjacent plunger gate may be half of the barrier gate pitch. A gate length of the barrier gates and/or plunger gates may be 20 to 70 nm.

The qubit device may be configured to apply a same barrier gate potential to every barrier gate. If combined with the regular arrangement of the barrier and plunger gates, this may further contribute to the periodicity of the potential along the row of quantum dots.

The set of nanomagnets may be arranged at a common level, over the set of control gate.

That is, each nanomagnet of the set of nanomagnets may be arranged at a (same) level with respect to the substrate layer, over the set of control gates. Arranging the nanomagnets at a level over the gates may facilitate manufacturing. Further the height (i.e. vertical dimension) of the nanomagnets may be chosen freely without influencing the level of the gates above the semiconductor substrate layer. This arrangement may also prevent the nanomagnets from disturbing the gates If the set of control gates comprises barrier gates and plunger gates as discussed above, the barrier gates and plunger gates may be arranged at a (same) first level over the substrate layer, and the set of nanomagnets may be arranged at a (same) second level over first level.

If the set of control gates further comprises a pair of confinement gates as discussed above, the confinement gates may be arranged at a third level over the substrate, the third level located below the second level. The nanomagnets, the barrier and plunger gates, and the confinement gates may hence be disposed at different respective levels above the substrate layer, thereby enabling a stacked and accordingly area efficient design. The third level of the confinement gates may be below the first level of the barrier and plunger gates. However, an alternative configuration is also possible.

According to embodiments, the qubit device may further comprise a dielectric layer structure arranged on the substrate layer and embedding the set of control gates, wherein the quantum dots may be defined at an interface between the substrate layer and the dielectric layer structure. This enables a monolithic qubit device, which may be fabricated in a rational manner relying on processing techniques from conventional CMOS device fabrication, e.g. dielectric layer deposition, gate layer deposition and patterning etc.

According to embodiments, the qubit device may be configured to transfer a qubit to a selected quantum dot of said every other quantum dot, from an adjacent quantum dot, by varying a potential of a plunger gate associated with the selected quantum dot and a potential of a plunger gate associated with said adjacent quantum dot, and supply a radio-frequency electric or magnetic control field to the selected qubit at the selected quantum dot to control a spin state of the selected qubit.

Hence, selective qubit control is enabled by transferring/shuttling a qubit (e.g. electron) from a second/idle quantum dot to a first/active quantum dot.

According to ESR-based qubit control, an AC magnetic control field resonant with the selected qubit may be applied to rotate the spin of the qubit.

The nanomagnets also enables EDSR-based qubit control: The magnetic field generated by each nanomagnet may induce, at the quantum dot underneath, a spatial magnetic gradient field with a non-zero in-plane component.

Thus, every other quantum dot (i.e. every first quantum dot) may be defined within a spatially varying magnetic field, thereby allowing qubit control by means of EDSR. The component may advantageously be an in-plane component (with respect to the substrate layer) transverse to the row direction as this may facilitate a faster response of the spin rotation and oscillatory control of the qubit.

That is, the qubit device may be configured to control a spin state of a qubit held at a quantum dot by spatially oscillating the qubit within the magnetic gradient field along a direction transverse to a longitudinal direction of the row of qubits, using a pair of control gates arranged at opposite sides of the row of quantum dots.

The pair of control gates may generate a varying electrical field such that the qubit due to its oscillation is subjected to a varying out-of-plane magnetic field resonant with the qubit spin resonance frequency.

The pair of control gates may advantageously be the pair of longitudinal confinement gates discussed above. The confinement gates may accordingly generate a varying electrical field such that each qubit in the row of quantum dots oscillate at a frequency such that spin resonance (i.e. spin rotation) is induced only in qubits in a first quantum dot (i.e. underneath a nanomagnet).

A gradient amplitude at each quantum dot may be at least 0.1 mT/nm, advantageously at least 0.4 mT/nm, e.g. along the transverse direction.

According to embodiments, the qubit device may further comprise one or more radio-frequency resonators connected to plunger gates of the set of control gates. This enables qubit-read out by detecting a spin-dependent resonance frequency.

The qubit device may comprise a set of radio-frequency resonators, each resonator may be connected to a respective plunger gate of the set of control gates. This enables read out of qubits held by quantum dots associated with a plunger gate connected to a resonator.

Each resonator may for example be connected to a respective plunger gate arranged at a quantum dot defined underneath a nanomagnet (i.e. a respective first quantum dot).

The qubit device may be configured to transfer a qubit to be read to a selected quantum dot associated with a plunger gate connected to a resonator, from an adjacent quantum dot, by varying a potential of the plunger gate associated with the selected quantum dot and a potential of a plunger gate associated with said adjacent quantum dot, and subsequently detect a resonance frequency of the resonator connected to the plunger gate associated with the selected quantum dot.

Hence, selective qubit readout is enabled by transferring/shuttling a qubit (e.g. electron) to a quantum dot associated with a plunger gate and sensing a resulting resonance frequency of the resonator associated with the quantum dot.

According to embodiments, the qubit device may further comprise an ESR transmission line extending along the row of quantum dots. The ESR transmission line may be arranged at a level above the nanomagnets, to allow for a smaller separation between the nanomagnets and the quantum dots.

According to embodiments, the qubit device may further comprise a non-magnetic metal layer connected to the nanomagnets. The nanomagnets may thereby be maintained at a same potential. The non-magnetic metal layer may advantageously be arranged on top of the nanomagnets. The non-magnetic metal layer may further be connected to ground. A risk of electric discharge during operation may hence be mitigated.

The qubit device may further comprise a pair of reservoir gates arranged at opposite ends of the row of qubits and configured to supply qubits to the row of qubits.

According to second aspect of the present inventive concept there is provided a method for operating a qubit device, the method for operating a qubit device, the method comprising:
 defining a row of electrostatically confined quantum dots along a substrate layer using a set of control gates, each quantum dot being suitable for holding a qubit,
 wherein every other quantum dot is defined under a respective nanomagnet of a set of nanomagnets arranged in a row over the substrate layer, wherein each nanomagnet has an out-of-plane magnetization with respect to the substrate layer, and wherein each one of every other quantum dot is subjected to an out of plane magnetic field generated by the respective nanomagnet, such that a qubit spin resonance frequency of every other quantum dot is shifted with respect to an adjacent quantum dot of the row of quantum dots This aspect may generally present the same or corresponding advantages as the former aspect. Reference is hence made to the above discussion. In particular, any reference to a function or operation of the qubit device or some element thereof described above may form a step or an act of the method.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
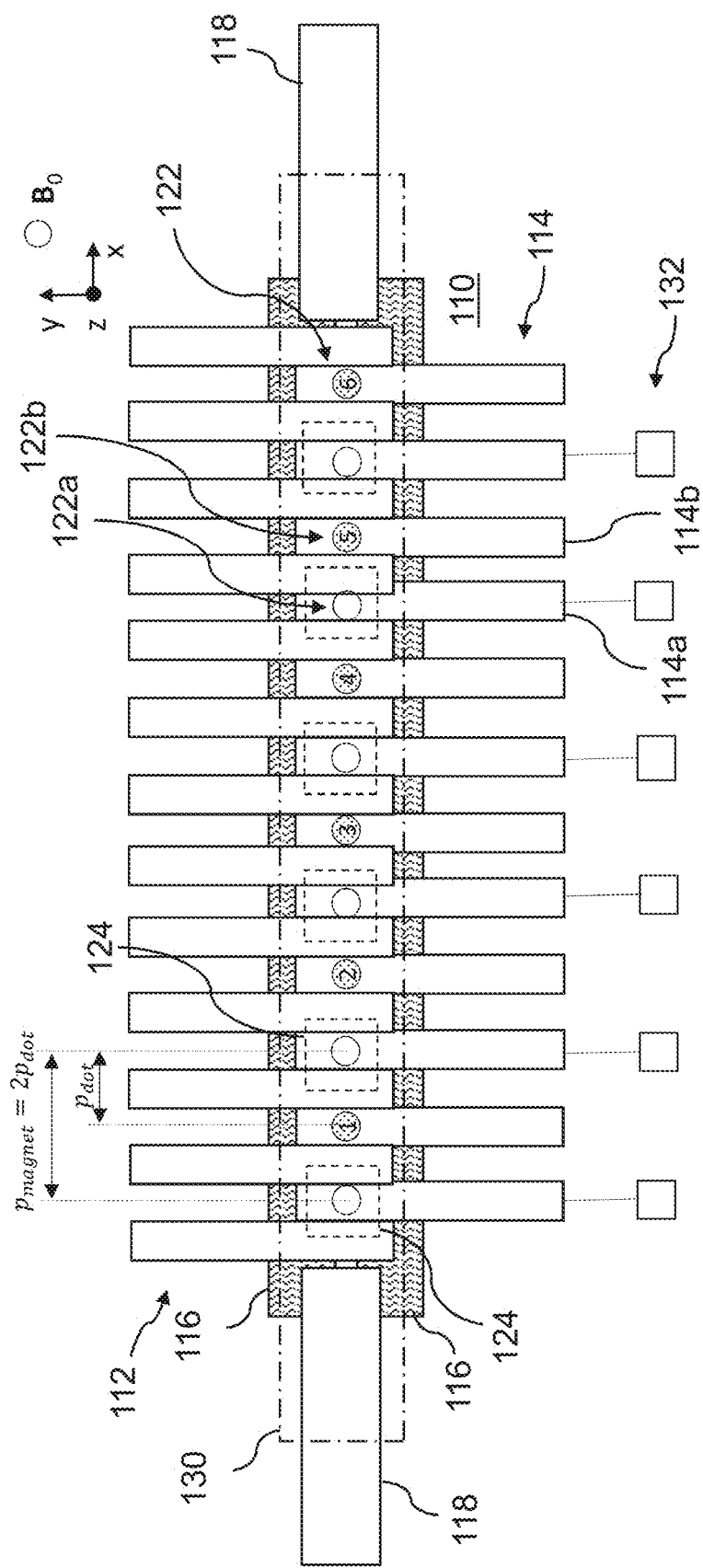
FIG. 1 is a schematic top-down view of a qubit device.

FIG. 1 is a schematic top-down view of a qubit device 100. The qubit device 100 may for example be used in a quantum computing device. Examples of algorithms which may be implemented include quantum chemistry algorithms and Grover's search algorithm. Some of the elements of the qubit device 100 depicted in FIG. 1 are shown with transparency, to allow a simultaneous view of underlying elements. The qubit device 100 comprises a semiconductor substrate layer 110. The substrate layer 110 may be a silicon layer, e.g. of isotropically purified silicon. Other example materials for the substrate layer 110 include GaAs and SiGe. x and y indicate a first and a second in-plane direction, respectively, with respect to the substrate layer 110, i.e. being parallel to the substrate layer 110. z indicates an out-of-plane direction, e.g. normal to the substrate layer 110. It is to be noted that also a negative z-direction (i.e. −z) is to be considered an out-of-plane direction with respect to the substrate layer 110. Directions x and y may also be referred to as first and second horizontal directions, while z may be referred to as a vertical direction.

The qubit device 100 comprises set of control gates 112, 114, 116 configured to define a row of electrostatically confined quantum dots 122 along the substrate layer 110. As will be further described below, the qubit device 100 may comprise a dielectric layer defining a dielectric-semiconductor interface along the substrate layer 110, wherein the qubits 122 may be defined at the interface. The row (i.e. the longitudinal direction thereof) may be defined to extend in parallel to the x direction. Accordingly, the direction transverse to the row-direction (i.e. the transverse direction of the row) may be parallel to the y direction. The quantum device 100 is accordingly suitable to implement a linear or 1D qubit array. As may be appreciated a quantum computing device may comprise a plurality of such 1D qubit arrays, operating independently from each other.

Each quantum dot 122 can hold one or more electrons defining a qubit. For simplicity, the following disclosure will however refer to single-electron qubits. It is further contemplated that the principles of the qubit device 100 are compatible with hole-based qubits, although holes due their intrinsic spin-orbit coupling may be more challenging to control.

The qubit device 100 further comprises a set of nanomagnets 124 arranged in a row over the substrate layer 110. As illustrated, the row of nanomagnets may extend over and along the row of quantum dots 122 (i.e. during operation of the device 100 when the row of quantum dots 122 is defined). Each nanomagnet 124 has an out-of-plane magnetization with respect to the substrate layer 110. Every other quantum dot 122a is defined underneath a respective one of the nanomagnets 124 and hence subjected to an out-of-plane magnetic field generated by the respective nanomagnet 124 above. In FIG. 1 and subsequent figures, a circle with no fill along the row of quantum dots 122 represents a quantum dot 122a ("a first/active quantum dot") located underneath a nanomagnet 124. A filled circle represents a quantum dot 122b ("a second/idle quantum dot") not located underneath a nanomagnet 124. It will hereby be assumed that the magnetization of the nanomagnets 124 and the corresponding magnetic field at each first quantum dot 122 is parallel to the out-of-plane direction z.

The magnetic field generated by a respective nanomagnet 124 causes a shifting of the qubit spin resonance frequency of the quantum dot 122a underneath the respective nanomagnet 124 with respect to an adjacent (neighboring) quantum dot 122b, above which there is no nanomagnet 124. The spin resonance frequency for a qubit in a magnetic field with strength B may be expressed as $E_{ZS}/h = g_e \mu_B B/h$, where $E_{ZS}$ is the Zeeman splitting between the spin states, h is the Planck constant, $g_e$ is the electron g-factor and $\mu_B$ is the Bohr magneton. The magnetic field strength experienced by a qubit at a first quantum dot 122a will be different from that experienced by a qubit at a second quantum dot 122b, and therefore also their resonance frequencies will be different.

As indicated in FIG. 1, a uniform magnetic field contribution $B_0$ with an out-of-plane orientation (e.g. parallel to the z or −z direction), may also be provided at the quantum dots 122. The magnetic field $B_0$, which for illustrative purposes may be referred to as an external magnetic field $B_0$, may be generated by a magnetic arrangement of one or more permanent magnets and/or electromagnets. As may be appreciated the magnetic field $B_0$ may also be generated by one or more magnets external to the qubit device 100.

The effective magnetic field experienced by a qubit in a quantum dot 122 may hence be given by the sum of the external magnetic field $B_0$ and the local magnetic field produced by the nanomagnets 124 at the position of the quantum dot 122. As may be appreciated, the nanomagnets 124 may thus cause a local variation of the out-of-plane magnetic field along the row of quantum dots 122 such that the qubit spin resonance frequencies of every first quantum dot 122a is shifted with respect to every adjacent second quantum dot 122b of the row.

Turning again to FIG. 1, every first quantum dot 122a may have a same first qubit spin resonance frequency and every second quantum dot 122b may have a same second spin resonance frequency. This enables control of a qubit in any one of the first quantum dots 122a using a same control signal. This applies correspondingly to a qubit in any one of the second quantum dots 122b. A same resonance frequency may be achieved e.g. using a set of identical nanomagnets 124, aligned with the quantum dots 122 such that each first quantum dot 122a and each second quantum dot 122b experience respective (at least substantially) equal magnetic field strengths along the z direction. It is however envisaged that e.g. different subsets of the first quantum dots 122a may have different respective qubit spin resonance frequencies (and correspondingly for the second quantum dots 122b), e.g. by using nanomagnets 124 with different strengths and/or arranged at different levels above the quantum dots 122.

The set of control gates of the illustrated qubit device 100 comprises barrier gates 112 and plunger gates 114 arranged alternatingly along the row-direction (i.e. along the x direction). In the following, reference sign 114 will be used to commonly refer to the plunger gates 114, while reference signs 114a and 114b will refer to a plunger gate associated with a first quantum dot 122a and a second quantum dot 122b, respectively. The set of control gates further comprises a pair of (longitudinal) confinement gates 116. The confinement gates 116 are arranged at mutually opposite sides of the row of quantum dots 122 and extend alongside the same. The quantum dots 122 may be electrostatically confined by the barrier gates 112 along the x direction and by the confinement gates 116 along the y direction. The barrier gates 112 and the confinement gates 116 may be biased to cause a depletion of free electrons underneath the gates 112, 116. The electrochemical potential of each quantum dot 122, and thus the number of accumulated electrons, may be controlled by a respective plunger gate 114a.

The barrier gates 112 may as shown each have a same gate length and be arranged with a regular pitch. The plunger gates 114 may similarly each have a same gate length and be arranged at a central position between a respective pair of barrier gates 112. The quantum dots 122 may thus be defined with a regular pitch/spacing corresponding to the pitch of the barrier gates, indicated by $p_{dot}$ in FIG. 1. The pitch/spacing of the nanomagnets 124 may correspond to twice the quantum dot pitch, $p_{magnet}=2p_{dot}$. For further increased regularly of the gate pattern, the gate length of the barrier gates 122 and the plunger gates 114 may be the same, however this is not a requirement.

By way of example, the quantum dot pitch may e.g. be on the order of 50 to 150 nm. A pitch of the barrier gates may be in the range of 50 to 150 nm. A center-to-center distance between a barrier gate and an adjacent plunger gate may be half of the barrier gate pitch. A gate length of the barrier gates and/or plunger gates may be 20 to 70 nm.

Each barrier gate 112 may be configured to apply a same barrier gate potential/voltage to every barrier gate 112. A height of the tunnel barrier between adjacent quantum dots 122a, 122b may thus be the same along the row of qubits 122. A tunnel barrier height may for example be in the range of 5-15 meV. This may yield a tunnel coupling $t_c$ of about 1 GHz, assuming a quantum dot pitch poor in the aforementioned range. Greater values of the tunnel coupling may be obtained with lower tunnel barrier heights. For example, a tunnel coupling $t_c$ in a range of 10-100 GHz may be achieved with a tunnel barrier height in the range of 40-400 peV. The voltages of the plunger gates 114 may be selected such that one or zero electrons is confined in the associated quantum dot 122.

Electrons defining the qubits may be loaded into/unloaded from the row of qubits 112 from respective electron reservoirs defined underneath respective reservoir gates 118 arranged at opposite ends of the row of qubits 122. The electron reservoirs may e.g. be 2DEGs.

Figure 3A:
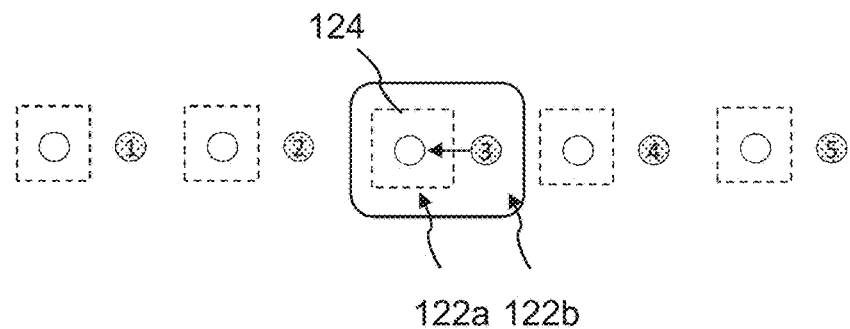
FIG. 3A-B schematically illustrate shuttling of a qubit between adjacent quantum dots and single- and two-qubit gates.
Figures 4A, 4B, 4C:
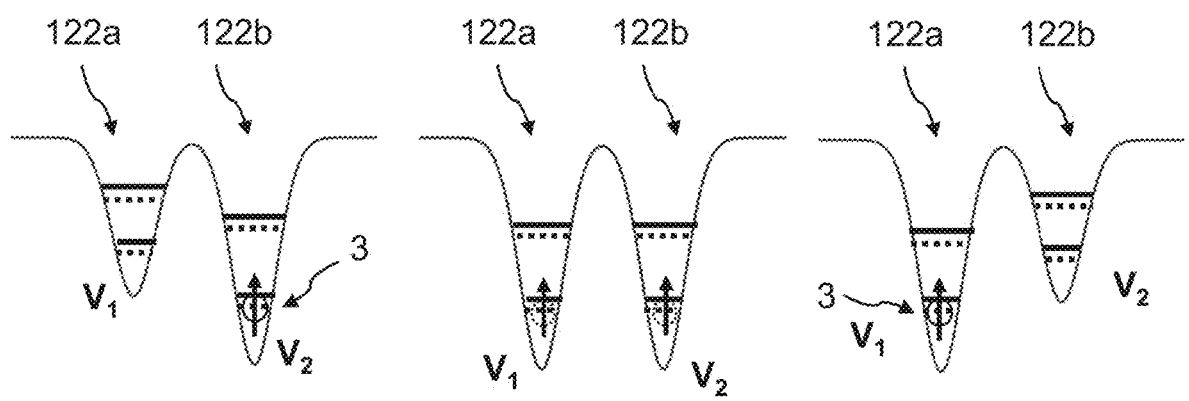
FIG. 4A-C schematically show control of quantum dot potential during qubit shuttling.

The qubit device 100 may implement shuttling of qubits along the row of quantum dots 122 by controlling a potential of the quantum dots 122. An example of shuttling/transferring a qubit ("qubit 3") between a pair of adjacent qubits 122a, 122b is schematically depicted in FIG. 3A. FIGS. 4A-C schematically illustrate the potential wells of the respective quantum dots 122a, 122b and the location of the qubit 3 prior to the transfer (FIG. 4A), during tunnelling (FIG. 4B) and after completing the transfer (FIG. 4C). The two pairs of a full line and a dotted line in the respective potential wells indicate the Zeeman splitting of the energy levels. A similar approach may be applied when loading/unloading electrons from/to an electron reservoir, by lowering or increasing a potential of the quantum dot 122 adjacent to the electron reservoir with respect to the potential of the electron reservoir.

Single-qubit gates may generally be implemented as follows: A selected qubit (e.g. "qubit 3") may be transferred to a first/active quantum dot 122a from an adjacent quantum dot 122b (e.g. as discussed in connection with FIGS. 3A and 4A-C). The qubit at the selected quantum dot 122a may then be subjected to a radio-frequency electric (for EDSR-based qubit control) or magnetic control field (for ESR-based qubit control) to control a spin state of the selected qubit.

Figure 3B:
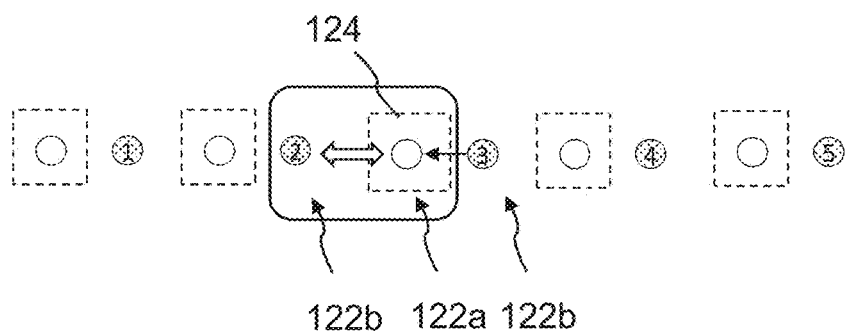

Two-qubit gates (e.g. CNOT/CZ) may as illustrated in FIG. 3B be implemented in a corresponding fashion, by transferring a selected first qubit (e.g. "qubit 3") to a first/active quantum dot 122a which is adjacent to second/idle quantum dot 122b also holding a qubit (e.g. "qubit 2"). A two-qubit operation (relying on either ESR or EDSR) may then be performed based on tuning of an exchange coupling between the qubits in the selected and adjacent quantum dots 122a, 122b (e.g. "qubits 2 and 3"). The exchange coupling may be tuned by varying a tunnel coupling or energy detuning between the quantum dots 122a, 122b.

For the purpose of supporting ESR-based qubit control, the qubit device 100 may further comprise an Electron spin resonance, ESR, transmission line 130 extending along the row of quantum dots 122. The qubit device 100 may comprise radio frequency generating circuitry for supplying ESR-control signals to the ESR transmission line 130 to implement ESR-based qubit control in a conventional manner.

The qubit device 100 may as an alternative or addition to ESR-based qubit control allow qubit control based on EDSR. Each nanomagnet 124 may induce a spatial magnetic gradient field with a non-zero in-plane component (e.g. dBy/dy) at the position of the associated quantum dot 122a. The spin state of qubit held at a first quantum dot 122a may hence be controlled through EDSR by spatially oscillating the qubit within the magnetic gradient field along the in-plane direction. An oscillation amplitude of about 1 nm is readily achievable by varying a potential of a pair of control gates arranged at opposite sides of the quantum dot, such as the confinement gates 116.

As an alternative to a transverse magnetic gradient field component dBy/dy, EDSR may rely on a longitudinal magnetic gradient field component dBx/dy in which case a longitudinal oscillation of the qubit within the magnetic gradient field may be controlled using a pair of barrier gates 112.

To enable read-out of qubit states, the qubit device 100 may further comprise one or more radio-frequency resonators, commonly indicated by reference sign 132 in FIG. 1. A resonator 132 may as shown be connected to each plunger gate 114a associated with a first quantum dot 122a. Each resonator 132 may be connected to the associated plunger gate 112 by means of a respective transmission line. The frequency of a resonator 132 will depend on a state of a qubit at the associated quantum dot 122a.

With reference to FIG. 3B, a state of a qubit may hence be detected by transferring a selected first qubit (e.g. "qubit 3") to a first/active quantum dot 122a associated with a resonator 132 and which is adjacent to second/idle quantum dot 122b also holding a qubit (e.g. "qubit 2"), and detecting the resulting resonance frequency, e.g. by measuring the reflectance of the resonator 132. When the qubits at adjacent quantum dots 122a, 122b are biased in an appropriate regime, the Pauli-spin exclusion principle results in spin-dependent tunneling of the qubit/electron to its adjacent quantum dot 122b. This spin-dependent inter-dot tunneling may modify the capacitance of the resonator 132 and hence its resonant frequency, facilitating spin readout.

According to an alternative configuration a resonator 132 may instead be connected to each plunger gate 114 associated with a second quantum dot 122b wherein read-out may be performed in a corresponding manner by transferring a qubit to be read to a quantum dot 122b associated with a plunger gate 114b. A similar read-out approach may be applied employing a common lumped element resonator connected to plunger gates 114, e.g. plunger gates 114a or 114b.

FIGS. 5A-D show various properties of a magnetic field which may be obtained using cobalt (Co) nanomagnets with a length dimension of 100 nm, a width dimension of 100 nm and a height of 200 nm, positioned 100 nm above quantum dots 122a. The boxes and circles indicate the locations of the nanomagnets 124 and first/second quantum dots 122a/122b, respectively, relative to the magnetic field.

Figure 5A:
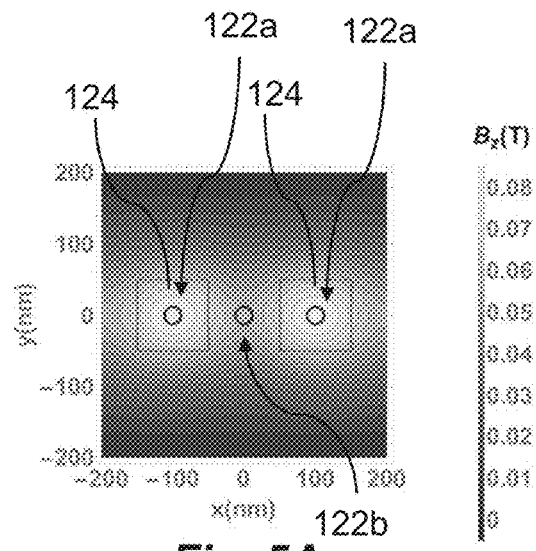
FIG. 5A-D show various properties of a magnetic field obtained using an example configuration of nanomagnets.

FIG. 5A shows the strength of the out-of-plane component $B_z$ of an effective magnetic field in a region of two first quantum dots 122a and an adjacent second quantum dot 122b. The axes indicate the spatial coordinate with respect to the second quantum dot 122b, in units of nanometer. As indicated, the use of nanomagnets 124 makes it possible to obtain a difference in magnetic field strength at a first quantum dot 122a and a second quantum dot 122b of e.g. about 10 mT. This translates to a difference in the resonance frequencies of about 280 MHz, which is more than two order of magnitudes greater than a typical maximum qubit linewidth for electrostatically defined quantum dots (e.g. about 1 MHz).

Figure 5C:
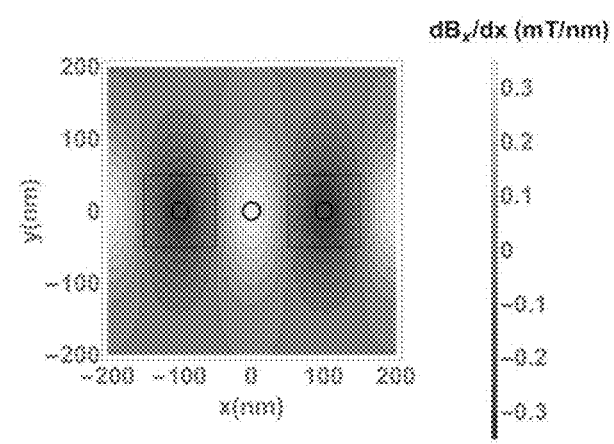
Figure 5B:
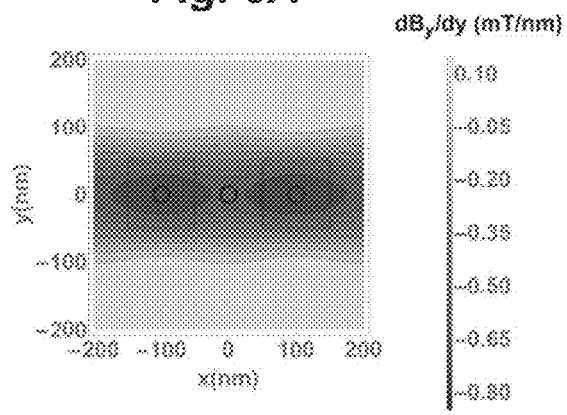

FIG. 5B shows the transverse magnetic gradient field component dBy/dy. As shown, the use of nanomagnets 124 enable an in-plane magnetic gradient on the order of 0.5 mT/nm.

FIG. 5C shows the longitudinal magnetic gradient field component dBx/dx, which is on the order of 0.3 mT/nm in the quantum dots 122a, 122b.

Figure 5D:
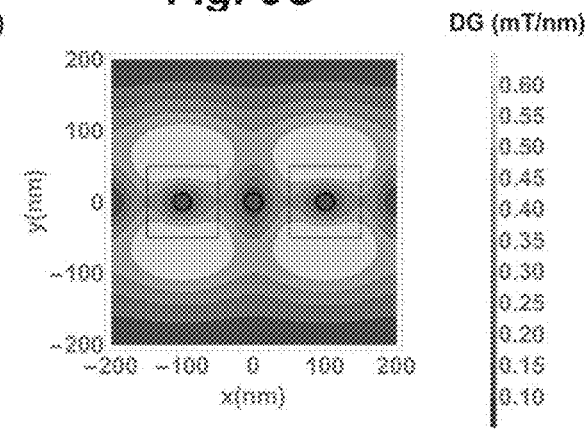

FIG. 5D shows the dephasing gradient for the example configuration of nanomagnets 124, defined by DG= $\sqrt{(dzBx)^2+(dzBy)^2}$. The derivatives of the in-plane magnetic field with respect to the z direction cause dephasing when coupled with electric field noise. In an ideal periodic lattice DG should hence be zero, which as may be seen FIG. 5D is almost achieved for the example configuration.

FIG. 2A-F are schematic perspective and corresponding cross-sectional views which in greater detail show a structure and geometry of a qubit device 100.

Figure 2A:
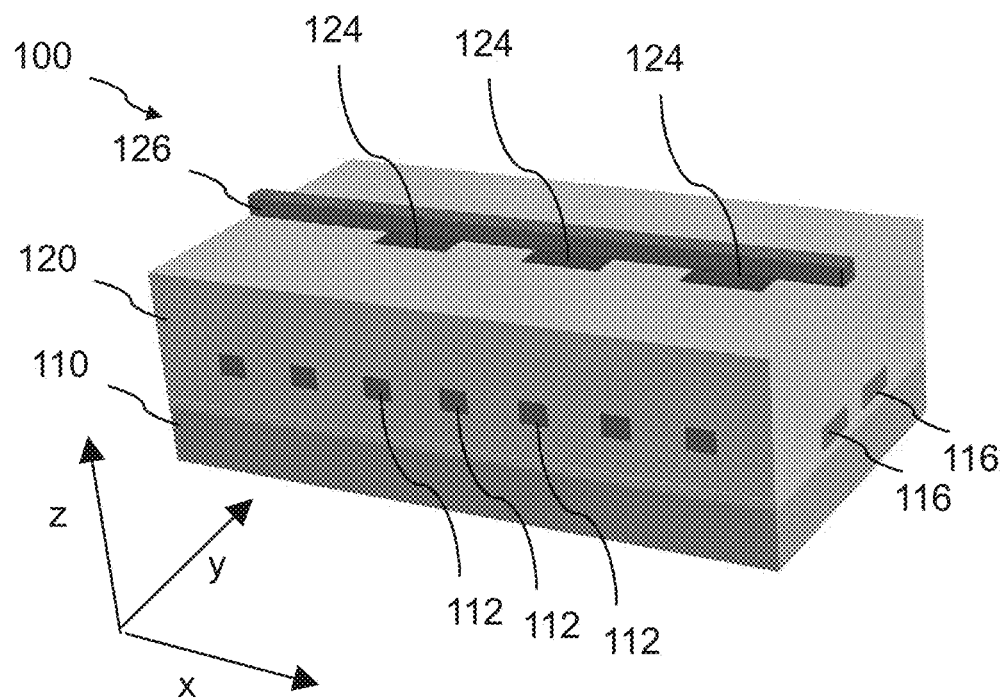
FIG. 2A-F are schematic perspective and corresponding cross-sectional views of a qubit device.
Figure 2B:
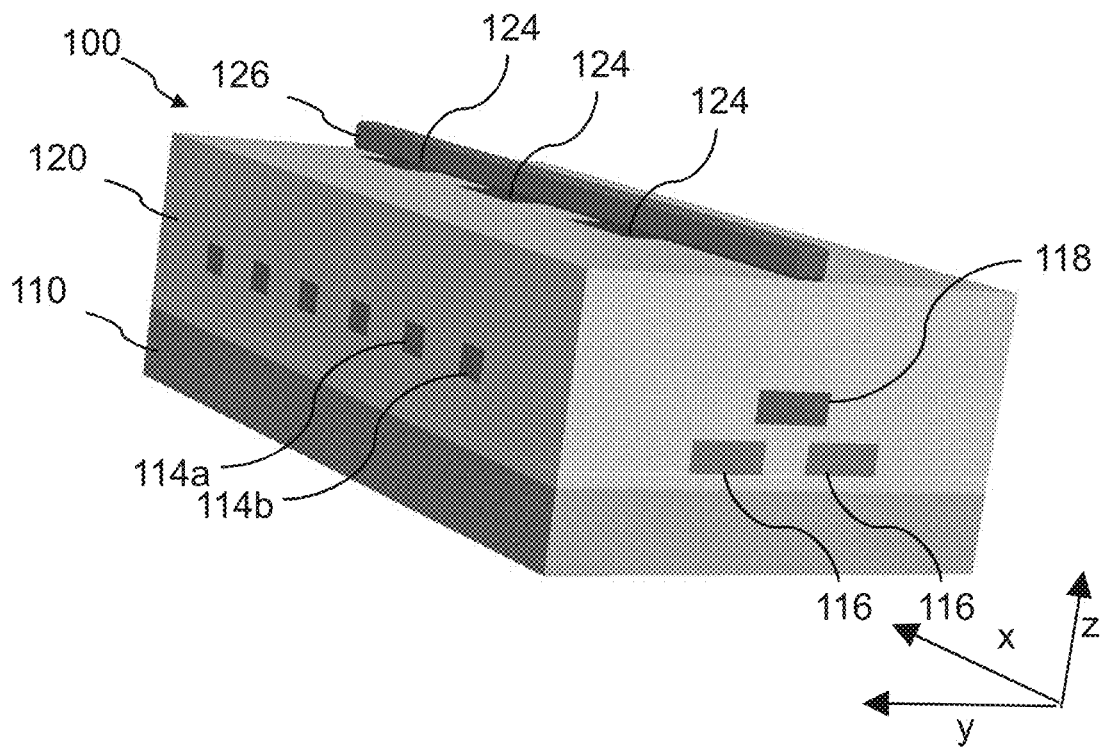

FIGS. 2A and 2B show parts of the qubit device 100 from two different perspectives. As shown, a dielectric layer structure 120 is arranged on the substrate layer 110 (which e.g. may be a silicon-layer) and embeds the set of control gates 112, 114, 116. The dielectric layer structure 120 is schematically shown as a single layer structure but may typically comprise multiple layers of different dielectric materials, such as different oxides e.g. silicon oxide and other conventional inter-layer dielectrics. As mentioned above, the quantum dots 122 may be defined at an interface between the substrate layer 100 and the dielectric layer structure 120. More specifically, the quantum dots 122 may be defined at an interface between a silicon substrate layer 110 and the bottom oxide layer of the dielectric layer structure 120. For a silicon substrate 110, a 5 to 20 nm thick silicon oxide may be present between the substrate 110 and the control gates 112, 114, 116.

Figure 2C:
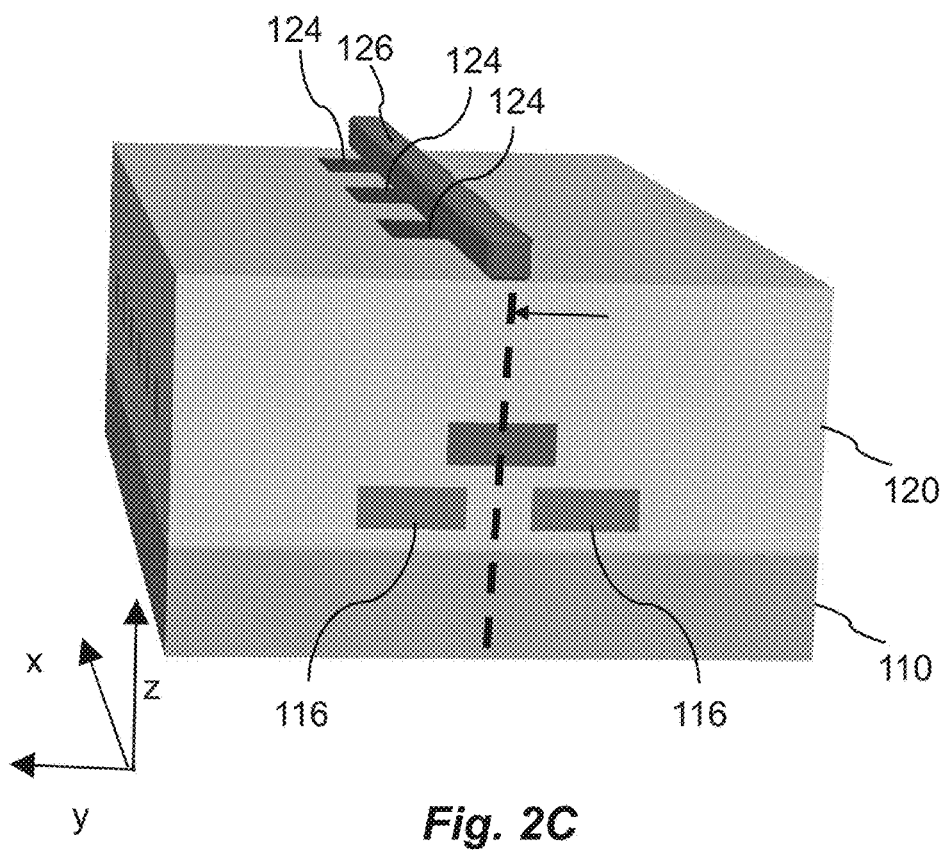
Figure 2D:
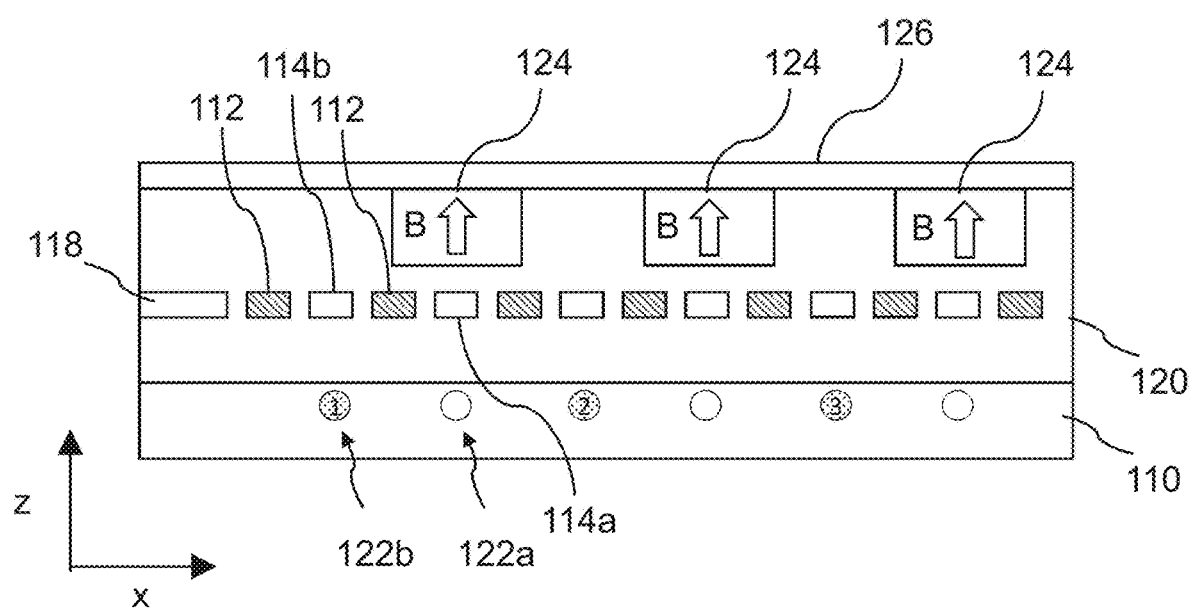

FIG. 2D shows a cross-section of the qubit device 100 taken along the line indicated in FIG. 2C. The barrier gates 112 and the plunger gates 114 may be arranged at a common first level over the substrate layer 110. The nanomagnets 124 may be arranged at a common second level over the substrate layer 110, located over the first level. The reservoir gates 118 may also be arranged at the first level. The confinement gates 116 may be arranged at a common third level over the substrate layer 110, located below the first and second levels. The common third level of the confinement gates 116 may in an alternative configuration be located above the first level, e.g. below the second level.

The second level of the nanomagnets 124 may be such that each quantum dot 122a is defined in the far field of the magnetic field of associated nanomagnet 124.

Figure 2E:
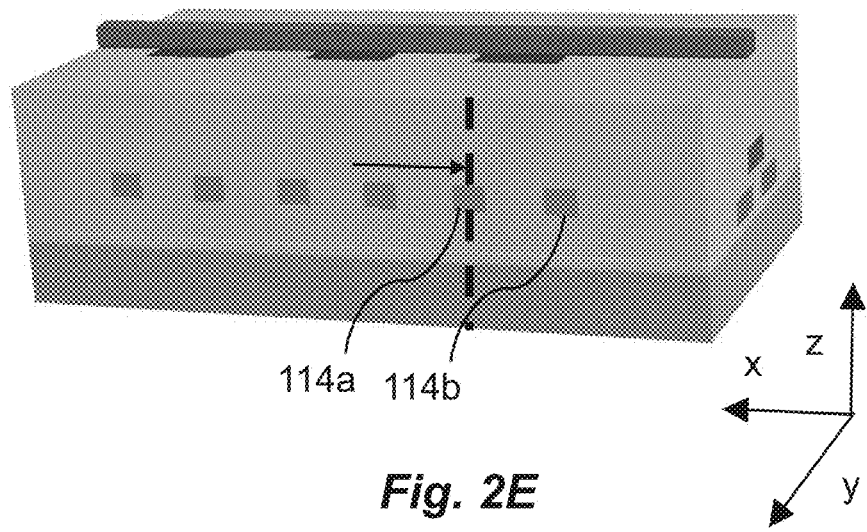
Figure 2F:
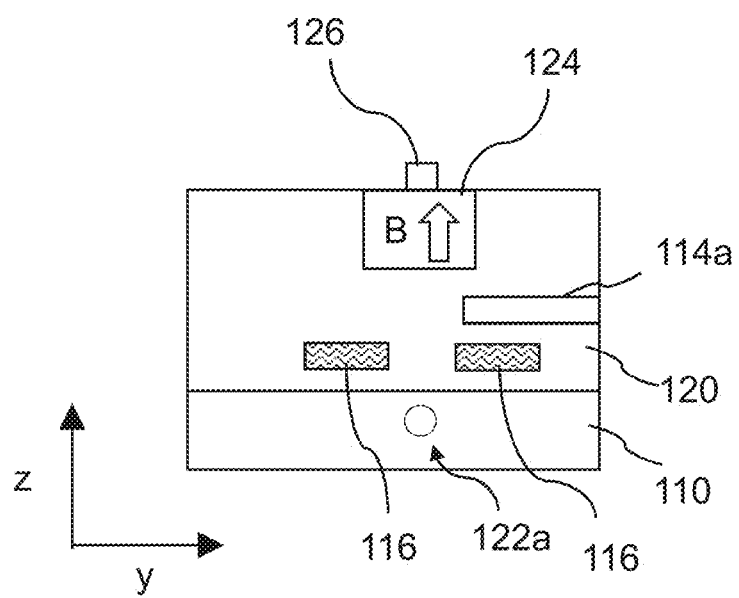

FIG. 2E shows a cross-section of the qubit device 100 taken along the line indicated in FIG. 2F. As illustrated, the plunger gates 114 may be arranged to not extend into a space between the nanomagnets 124 and the associated first quantum dots 122a.

The qubit device 100 may be fabricated using conventional CMOS processes, e.g. patterning of metal-oxide semiconductor stacks of suitable gate dielectric, gate electrode materials and substrate material (e.g. Si, Si-28, SiGe). The nanomagnets 124 may be fabricated of a suitable magnetic material at the appropriate locations and be embedded in dielectric material.

The qubit device 100 may further comprise a non-magnetic metal layer 126, e.g. in the shape of a line, connected to the nanomagnets 124. The metal layer 126 may be arranged on top of the nanomagnets 124, e.g. in direct contact with the upper surfaces of the nanomagnets 124. The metal layer 126 may reduce potential variations between the nanomagnets 124. The metal layer 126 may be connected to an electrical ground of the qubit device 100. Suitable non-magnetic materials for the metal layer 126 include TiN, Al and Au.

In the above the inventive concept has mainly been described with reference to a limited number of examples. However, as is readily appreciated by a person skilled in the art, other examples than the ones disclosed above are equally possible within the scope of the inventive concept, as defined by the appended claims.

For example, although the qubit devices 100 depicted in the figures comprise longitudinal confinement gates 116 it is also possible to provide a transverse confinement of the quantum dots by confining quantum dots using barrier gates 112 and plunger gates 114 arranged alternatingly along a horizontal nanowire with a transverse dimension of a few nanometers, e.g. patterned in a semiconductor substrate layer. In other words, the row of quantum dots 112 may be electrostatically confined along the nanowire by the barrier gates 112 and plunger gates 114 and physically confined by the nanowire along the transverse direction.

The invention claimed is:

1. A qubit device comprising:
   a semiconductor substrate layer;
   a set of control gates configured to define a row of electrostatically confined quantum dots along the substrate layer, each quantum dot being suitable for holding a qubit; and
   a set of nanomagnets arranged in a row over the substrate layer such that a nanomagnet is arranged above every other quantum dot of the row of quantum dots,
   wherein each nanomagnet has an out-of-plane magnetization with respect to the substrate layer and wherein said every other quantum dot is subjected to an out-of-plane magnetic field generated by a respective nanomagnet, such that a qubit spin resonance frequency of said every other quantum dot is shifted with respect to an adjacent quantum dot of the row of quantum dots, and
   wherein the set of control gates comprises barrier gates and plunger gates arranged alternatingly along a longitudinal direction of the row of quantum dots, wherein the barrier gates are configured to confine the quantum dots in a longitudinal direction of the row of quantum dots, the plunger gates are configured to control a potential of a respective quantum dot, and the set of nanomagnets are arranged above every other plunger gate.

2. A qubit device according to claim 1, wherein said every other quantum dot have a same first qubit spin resonance frequency and every said adjacent quantum dot have a same second spin resonance frequency.

3. A qubit device according to claim 1, wherein the set of control gates further comprises a pair of longitudinal confinement gates arranged at mutually opposite sides of the row of quantum dots to laterally confine the quantum dots.

4. A qubit device according to claim 1, wherein the barrier gates have a same gate length and are arranged with a regular pitch, and wherein the plunger gates have a same gate length and each plunger gate is centred between a respective pair of barrier gates.

5. A qubit device according to claim 1, wherein the set of nanomagnets are arranged at a common level, over the set of control gates.

6. A qubit device according to claim 1, further comprising a dielectric layer structure arranged on the substrate layer and embedding the set of control gates, wherein the quantum dots are defined at an interface between the substrate layer and the dielectric layer structure.

7. A qubit device according to claim 1, wherein the qubit device is configured to transfer a qubit to a selected quantum dot of said every other quantum dot, from an adjacent quantum dot, by varying a potential of a plunger gate associated with the selected quantum dot and a potential of a plunger gate associated with said adjacent quantum dot, and supply a radio-frequency electric or magnetic control field to a selected qubit at the selected quantum dot to control a spin state of the selected qubit.

8. A qubit device according to claim 1, wherein the magnetic field generated by each nanomagnet induces, at the quantum dot underneath, a spatial magnetic gradient field with a non-zero in-plane component.

9. A qubit device according to claim 8, wherein the qubit device is configured to control a spin state of a qubit held at a quantum dot by spatially oscillating the qubit within the magnetic gradient field along a direction transverse to a longitudinal direction of a row of qubits, using a pair of control gates arranged at opposite sides of the row of quantum dots.

10. A qubit device according to claim 1, further comprising one or more radio-frequency resonators connected to plunger gates of the set of control gates.

11. A qubit device according to claim 10, wherein the qubit device is configured to transfer a qubit to be read to a selected quantum dot associated with a plunger gate connected to a resonator, from an adjacent quantum dot, by varying a potential of the plunger gate associated with the selected quantum dot and a potential of a plunger gate associated with said adjacent quantum dot, and subsequently detect a resonance frequency of the resonator connected to the plunger gate associated with the selected quantum dot.

12. A qubit device according to claim 1, further comprising an Electron spin resonance, ESR, transmission line extending along the row of quantum dots.

13. A qubit device according to claim 1, further comprising a non-magnetic metal layer connected to the nanomagnets.

14. A qubit device according to claim 1, wherein the row of electrostatically confined quantum dots is a single row.

15. A method for operating a qubit device, the method comprising:
    defining a row of electrostatically confined quantum dots along a substrate layer using a set of control gates, each quantum dot being suitable for holding a qubit,
    wherein every other quantum dot is defined under a respective nanomagnet of a set of nanomagnets arranged in a row over the substrate layer, wherein each nanomagnet has an out-of-plane magnetization with respect to the substrate layer, and wherein each one of said every other quantum dot is subjected to an out of plane magnetic field generated by the respective nanomagnet, such that a qubit spin resonance frequency of said every other quantum dot is shifted with respect to an adjacent quantum dot of the row of quantum dots, and
    wherein the set of control gates comprises barrier gates and plunger gates arranged alternatingly along a longitudinal direction of the row of quantum dots, wherein the barrier gates are configured to confine the quantum dots in a longitudinal direction of the row of quantum dots, the plunger gates are configured to control a potential of a respective quantum dot, and the set of nanomagnets are arranged above every other plunger gate.

16. A method for operating a qubit device according to claim 15, wherein the set of control gates further comprises a pair of longitudinal confinement gates arranged at mutually opposite sides of the row of quantum dots to laterally confine the quantum dots.

17. A method for operating a qubit device according to claim 15, further comprising transferring a qubit to a selected quantum dot of said every other quantum dot from an adjacent quantum dot by varying a potential of a plunger gate associated with the selected quantum dot and a potential of a plunger gate associated with said adjacent quantum dot, and supplying a radio-frequency electric or magnetic control field to a selected qubit at the selected quantum dot to control a spin state of the selected qubit.

18. A method for operating a qubit device according to claim 15, wherein the row of electrostatically confined quantum dots is a single row.

\* \* \* \* \*